US 11,308,811 B2

United States Patent
Yamamoto et al.

(10) Patent No.: US 11,308,811 B2
(45) Date of Patent: Apr. 19, 2022

(54) MARKER DETECTION METHOD AND VEHICULAR SYSTEM

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

( * ) Notice: Subject to any disclaimer, the term of this patent is extended or adjusted under 35 U.S.C. 154(b) by 185 days.

(21) Appl. No.: 16/622,310

(22) PCT Filed: Jun. 7, 2018

(86) PCT No.: PCT/JP2018/021792
§ 371 (c)(1),
(2) Date: Dec. 13, 2019

(87) PCT Pub. No.: WO2018/230423
PCT Pub. Date: Dec. 20, 2018

(65) Prior Publication Data
US 2021/0150905 A1     May 20, 2021

(30) Foreign Application Priority Data
Jun. 14, 2017   (JP) .............................. JP2017-116969

(51) Int. Cl.
*G08G 1/16*        (2006.01)
*G01R 33/022*     (2006.01)
(Continued)

(52) U.S. Cl.
CPC ........... *G08G 1/167* (2013.01); *G01R 33/022* (2013.01); *G01V 3/165* (2013.01); *G01V 3/38* (2013.01);
(Continued)

(58) Field of Classification Search
None
See application file for complete search history.

(56) References Cited

U.S. PATENT DOCUMENTS 5,191,528 A      3/1993 Yardley et al.
10,969,245 B2 *  4/2021 Yamamoto ........... G05D 1/0259

FOREIGN PATENT DOCUMENTS

EP    1020707 A1    7/2000
JP    08-044427 A   2/1996
(Continued)

OTHER PUBLICATIONS

Extended European search report dated Feb. 15, 2021, in corresponding European patent Application No. 18817586.3, 11 pages.
(Continued)

*Primary Examiner* — Hunter B Lonsberry
*Assistant Examiner* — Paysun Wu
(74) *Attorney, Agent, or Firm* — Xsensus LLP

(57) ABSTRACT

A marker detection method in which a magnetic detection unit (11) of a vehicle side that includes a plurality of magnetic sensors arranged in a vehicle width direction is used to detect magnetic markers (10) that are laid in a road, the method executes detection of a center position in the vehicle width direction of a magnetic distribution that acts on the magnetic detection unit (11) and processing of an index representing a degree of a positional change of the center position when a vehicle (5) passes over the magnetic markers (10) to determine a possibility of the presence of magnetic generation sources that causes disturbance, thereby suppressing erroneous detection of the magnetic markers (10).

22 Claims, 13 Drawing Sheets

(51) Int. Cl.
　　　*G01V 3/165*　　　(2006.01)
　　　*G01V 3/38*　　　(2006.01)
　　　*G05D 1/02*　　　(2020.01)
(52) U.S. Cl.
　　　CPC ... *G05D 1/0261* (2013.01); *G05D 2201/0213* (2013.01)

(56) References Cited

FOREIGN PATENT DOCUMENTS

| | | | |
|---|---|---|---|
| JP | 09184738 A | * | 7/1997 |
| JP | 09-292238 A | | 11/1997 |
| JP | 11-095837 A | | 4/1999 |
| JP | H1194566 A | * | 4/1999 |
| JP | 2000-227998 A | | 8/2000 |
| JP | 2002-039707 A | | 2/2002 |
| JP | 2005-202478 A | | 7/2005 |
| JP | 2007-132689 A | | 5/2007 |
| JP | 2017-083189 A | | 5/2017 |

OTHER PUBLICATIONS

International Search Report and Written Opinion dated Aug. 21, 2018 for PCT/JP2018/021792 filed on Jun. 7, 2018, 9 pages including English Translation of the International Search Report.

* cited by examiner

MARKER DETECTION METHOD AND VEHICULAR SYSTEM

CROSS-REFERENCE TO RELATED APPLICATIONS

The present application is based on PCT filing PCT/JP2018/021792, filed Jun. 7, 2018, which claims priority to JP 2017-116969, filed Jun. 14, 2017, the entire contents of each are incorporated herein by reference.

TECHNICAL FIELD

The present invention relates to a marker detection method and a vehicular system for detecting a magnetic marker laid in a road.

BACKGROUND ART

Conventionally, a vehicular marker detection system for using a magnetic marker laid in a road for vehicle control is known (see, for example, Patent Literature 1). If such a marker detection system is used, for example, to detect magnetic markers laid along the road, various driving assist such as automatic steering control, lane departure warning, automatic driving, and so forth can be achieved.

CITATION LIST

Patent Literature

Patent Literature 1: Japanese Unexamined Patent Application Publication No. 2005-202478

SUMMARY OF INVENTION

Technical Problem

However, the conventional marker detection system described above has the following problems. That is, due to various disturbance magnetism acting on a magnetic sensor or the like, there is a problem that a reliability of detection of the magnetic marker may be impaired. For example, such as an iron manhole cover or other vehicles may become sources of magnetic disturbance.

The present invention has been made in view of the above-described conventional problems, and an object of the present invention is to provide a marker detection method and a vehicular system for suppressing erroneous detection.

Solution to Problem

One aspect of the present invention resides in a marker detection method of detecting magnetic markers laid in a road by using a vehicle side magnetic detection unit with a plurality of magnetic sensors arranged in a vehicle width direction, the method including, a marker detection process wherein a magnetic marker is detected by determining whether or not the magnetic detection unit is positioned straight above the magnetic marker during traveling of a vehicle, the marker detection process identifying a lateral shift amount of the vehicle with reference to the magnetic marker detected; and a determination process wherein a center position of a magnetic distribution in the vehicle width direction acting on the magnetic detection unit is identified regardless of whether or not the magnetic markers are detected, the determination process determining a possibility of a presence of a magnetic generation source that causes disturbance by processing an index representing a degree of a positional change of the center position in accordance with traveling of the vehicle.

One aspect of the present invention resides in a vehicular system which detects magnetic markers laid in a road, the system including, a magnetic detection unit with a plurality of magnetic sensors arranged in a vehicle width direction, and a determining unit which determines a presence or absence of a magnetic generation source that causes disturbance, wherein a possibility of the presence of the magnetic generation source is determined by performing the above-described marker detection method.

Advantageous Effects of Invention

For example, when the vehicle travels tracking a lane in which the magnetic markers are laid, it can be expected that the center position of the magnetic distribution in the vehicle width direction acting on the magnetic detection unit will be nearly constant. In this case, it can be predicted that the positional change of the center position of the magnetic distribution in the vehicle width direction will be close to zero. The marker detection method according to the present invention is a method of determining the possibility of the presence of the magnetic generation source other than the magnetic marker, that causes disturbance based on such knowledge.

In the marker detection method according to the present invention, the possibility of the presence of the magnetic generation source is determined by processing an index representing a degree of positional change of the center position of the magnetic distribution in the vehicle width direction acting on the magnetic detection unit. And the vehicular system concerning the present invention determines the possibility of the presence of the magnetic generation source by performing this marker detection method.

According to the present invention, it is possible to reduce erroneous detection of the magnetic marker by determining the possibility of the presence of the magnetic generation source that causes disturbance.

DESCRIPTION OF EMBODIMENTS

Figure 1:
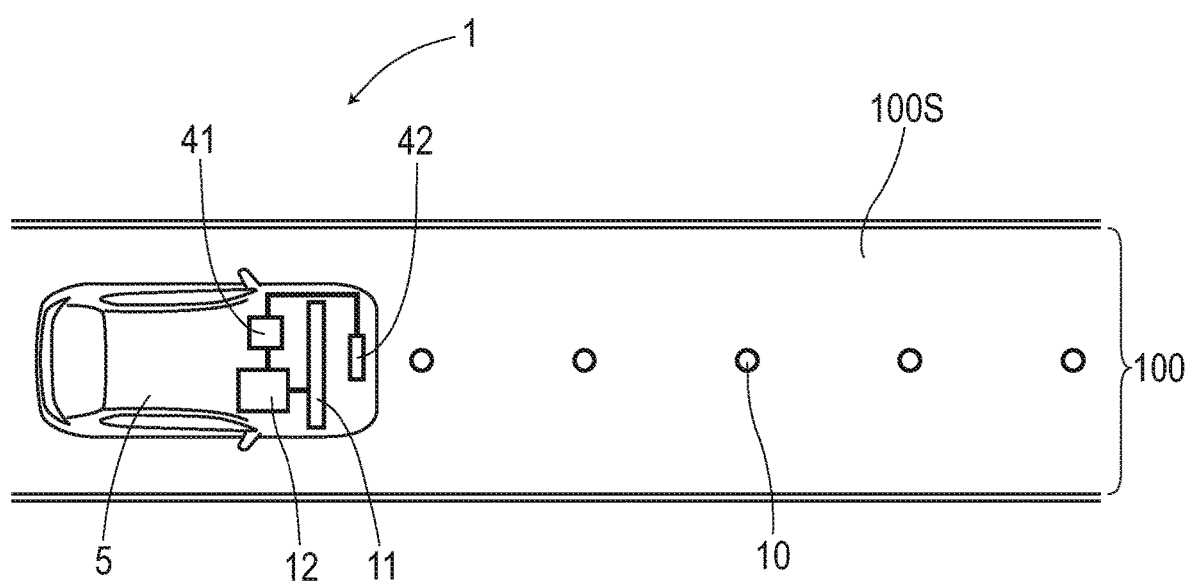
FIG. 1 is a descriptive diagram depicting a vehicular system.

A preferred embodiment of the present invention will be described. In the marker detection method according to the present invention, when the vehicle travels on the road where the magnetic markers are laid, it is preferable to repeatedly detect the center position every time the vehicle passes over each of the magnetic markers, and generate the index representing the degree of the positional change of the center position.

In this case, when the vehicle travels on a road in which the magnetic markers are laid, it is possible to efficiently determine the possibility of the presence of the magnetic generation source that causes disturbance.

In the present invention, the index may be a positional change amount or a change rate of the center position.

When the magnetic generation source that causes disturbance is present in a vicinity of the magnetic marker, a value of the positional change amount or the change rate of the center position is likely to increase. For example, it is also possible to determine the presence or absence of the magnetic generation source by executing threshold process relating to the change amount or change rate.

In the marker detection method according to the present invention, the index may be corrected by a degree of a change of a steering angle of a steering wheel of the vehicle or a yaw rate generated on the vehicle.

For example, when an abrupt steering was performed on the vehicle side, there is a high possibility that the degree of positional change of the center position will increase even when there is no magnetic generation source. Therefore, if the index is corrected by the degree of change in the steering angle or the yaw rate, for example, erroneous determination regarding the magnetic generation source can be avoided even when the abrupt steering is performed.

In the marker detection method according to the present invention, it is preferable to determine the possibility of the presence of the magnetic generation source when the degree of the change of the steering angle of the steering wheel of the vehicle or a value of the yaw rate generated on the vehicle is smaller than a predetermined threshold value.

When the degree of change in the steering angle or the value of the yaw rate is equal to or larger than the predetermined threshold value, there is a high possibility that the vehicle is in midst of changing its course direction. In such a travelling situation, the magnetic generation source cannot be determined with high accuracy. If the possibility of the presence of the magnetic source is determined when the degree of change of the steering angle or the value of the yaw rate is less than the predetermined threshold value, the determination accuracy can be maintained high.

The vehicular system according to the present invention includes a control unit which performs control for assisting driving of a vehicle, wherein the control unit may switch control contents including whether or not to perform control for assisting driving in accordance with the possibility of the presence of the magnetic generation source.

If the control contents are switched in accordance with the possibility of the presence of the magnetic generation source, the possibility of the control becoming unstable due to the magnetic generation source other than the magnetic marker can be avoided.

EMBODIMENTS

The embodiment of the present invention will be specifically described with reference to the following embodiments.

First Embodiment

This embodiment is an example related to a marker detection method and a vehicular system 1 for detecting a magnetic marker 10 laid in a road. The details of this will be described with reference to FIG. 1 to FIG. 13.

Figure 2:
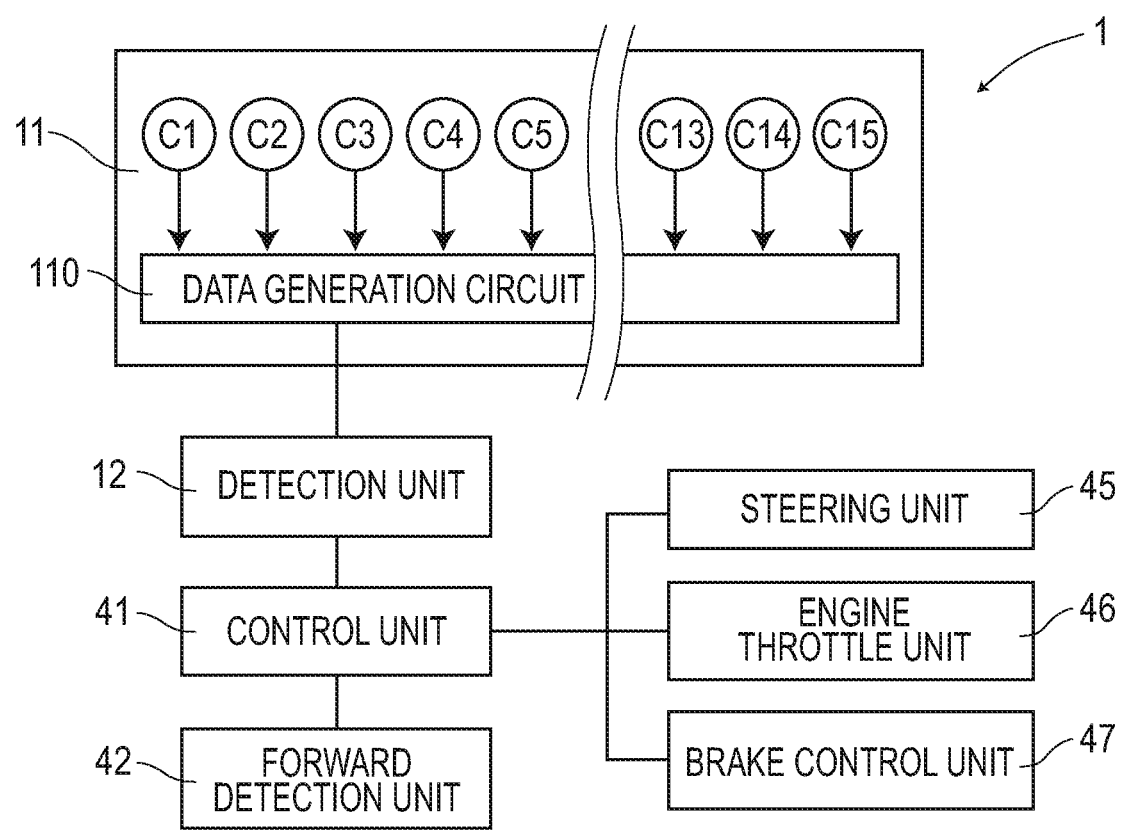
FIG. 2 is a block diagram depicting a configuration of a vehicular system.

In the marker detection method of this embodiment, as depicted in FIG. 1 and FIG. 2, the magnetic marker 10 is detected using a sensor unit 11 in which a plurality of magnetic sensors Cn (n is an integer from 1 to 15) are arranged in a vehicle width direction. In this marker detection method, in addition to a marker detection process for detecting the magnetic marker 10, a determination process for determining a possibility of the presence of a magnetic generation source other than the magnetic marker 10, that causes disturbance is performed.

In the determination process of the possibility of the presence of the magnetic generation source that causes disturbance, a magnetic distribution in the vehicle width direction is acquired using the sensor unit 11, and a center position of magnetic distribution in this vehicle width direction is detected. Then, an index that represents a degree of positional change of the center position of the magnetic distribution in the vehicle width direction at a time when a vehicle 5 passes over the magnetic marker 10 is processed to determine the possibility of the presence of the magnetic generation source that causes disturbance.

The vehicular system 1 is an example of a driving assist system that detects the magnetic marker 10 by executing the marker detection method described above, and causes the vehicle 5 to perform automatic traveling by tracking a lane 100 in which the magnetic markers 10 are laid.

This vehicular system 1 is configured to include a detection unit 12 in addition to the sensor unit 11 including the magnetic sensors Cn. The detection unit 12 is a unit that captures magnetic distribution data from the sensor unit 11 and executes various arithmetic processes. In addition to the marker detection process described above, the detection unit 12 executes the determination process described above for determining the presence or absence of the magnetic generation source other than the magnetic marker 10, that causes disturbance.

In addition to the sensor unit 11 and the detection unit 12 described above, the vehicular system 1 is provided with a forward detection unit 42 that measures a distance and so forth from a preceding vehicle, a steering unit 45 that can be controlled externally, an engine throttle unit 46, a brake control unit 47, a control unit 41 for controlling each unit, and so forth.

The steering unit 45 is a unit that controls a steering angle (rudder angle) of a steering wheel of the vehicle 5. The steering unit 45 includes a steering angle sensor, and is capable of measuring and externally outputting the steering angle. The engine throttle unit 46 is a unit that adjusts an engine output by controlling a throttle opening for feeding fuel to the engine. The brake control unit 47 is a unit that adjusts a braking force by controlling a hydraulic pressure or the like of working fluid of a brake system.

In the followings, after overviewing the magnetic marker 10, the forward detection unit 42, the sensor unit 11, the detection unit 12, and the control unit 41 will be described in order.

(Magnetic Marker)

The magnetic marker 10 is a road marker to be laid in the road surface 100S of a road on which the vehicle 5 travels (see FIG. 1). The magnetic markers 10 are arranged at spacings of 3 m, for example, along the center of the lane 100 divided by left and right lane marks.

Figure 3:
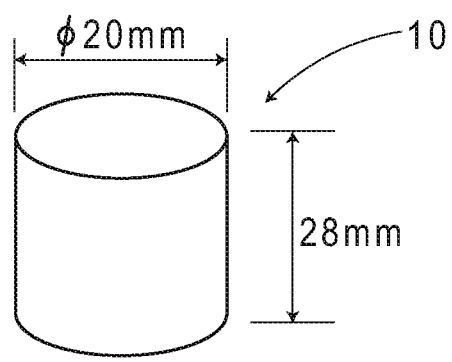
FIG. 3 is a diagram depicting a magnetic marker.

The magnetic marker 10 forms a columnar shape having a diameter of 20 mm and a height of 28 mm, as in FIG. 3 and is laid in a state of being accommodated in a hole provided on the road surface 100S. A magnet forming the magnetic marker 10 is an ferrite plastic magnet formed by dispersing a magnetic powder of iron oxide as a magnetic material in a polymer material as a base material, and has a characteristic of a maximum energy product (BHmax)=6.4 kJ/m$^3$.

Part of specifications of the magnetic marker 10 of the present embodiment is provided in Table 1.

TABLE 1

| Type of magnet | Ferrite plastic magnet |
|---|---|
| Diameter | φ 20 mm |
| Height | 28 mm |
| Magnetic flux density Gs of the surface | 45 mT |

This magnetic marker 10 can act with magnetism having a magnetic flux density of 8 μT (microtesla) at the height of 250 mm, which is an upper limit of a range from 100 to 250 mm, assumed as a mounting height of the sensor unit 11. Note that a magnetic flux density GS of the surface of the magnet forming the magnetic marker 10 is 45 mT (millitesla).

(Forward Detection Unit)

The forward detection unit 42 in FIG. 2 is a unit that measures the distance to an object using a laser beam. Although not depicted in the figure, this forward detection unit 42 is configured to include a laser beam emitting part, a light receiving part for reflected light, and a time measuring part for measuring delay time from emission of the light to reception of the reflected light. The laser beam emitting part includes a polygon mirror (rotating multifaceted mirror) for changing an emission direction of the laser beam.

A range of change of the emission direction by the polygon mirror is in a range of ±15 degrees in a horizontal direction. The forward detection unit 42 is capable of performing one-dimensional line scanning by changing the direction of the laser beam in this range. The forward detection unit 42 measures the above-mentioned delay time for each position in one-dimensional range of ±15 degrees in the horizontal direction, and identifies a distance to an object existing in this range.

The forward detection unit 42 is mounted so that a central axis of the emission direction coincides with the longitudinal direction of the vehicle 5. The forward detection unit 42 in the vehicle-mounted state generates and outputs distance information in which distance data is linked to each position belonging to the one-dimensional range of ±15 degrees in the horizontal direction on the front side of the vehicle 5.

(Sensor Unit)

The sensor unit 11 (FIG. 1 and FIG. 2) is a magnetic detection unit mounted to the bottom face of the vehicle 5. The sensor unit 11 is mounted to an inside of a front bumper, for example. In the case of the vehicle 5 of this embodiment, the mounting height with respect to the road surface 100S is 200 mm.

The sensor unit 11 includes fifteen magnetic sensors Cn arranged at spacings of 10 cm along the vehicle width direction, and a data generation circuit 110 that generates output data (see FIG. 2). The sensor unit 11 is mounted to the vehicle so that central magnetic sensor C8 of fifteen magnetic sensors Cn is positioned at the center of the vehicle 5 in the vehicle width direction.

The data generation circuit 110 is a circuit that generates and externally outputs magnetic distribution data of magnetic measurement values of magnetic sensors Cn in the vehicle width direction. After synchronizing and operating magnetic sensors Cn, the data generation circuit 110 is configured to generate the magnetic distribution data in the vehicle width direction by sequentially reading a magnetic measurement value of each magnetic sensor Cn.

The magnetic sensor Cn is an MI sensor that measures magnetism using a known MI effect (Magnet Impedance Effect) that the impedance of a magnetic sensitive body such as an amorphous wire changes sensitively according to an external magnetic field. The magnetic sensor Cn is configured to be capable of detecting the magnitude of magnetic components in two orthogonal directions. In the sensor unit 11, magnetic sensors Cn are incorporated so as to sense magnetic components in the forwarding direction and the vehicle width direction of the vehicle 5. Accordingly, the magnetic distribution data in the vehicle width direction generated by the data generation circuit 110 includes the following two types of magnetic distribution data in the vehicle width direction.

(First Magnetic Distribution Data)

The magnetic distribution data which represents a distribution of magnetic measurement values in the forwarding direction of each magnetic sensor Cn configuring the sensor unit 11.

(Second Magnetic Distribution Data)

The magnetic distribution data which represents a distribution of the magnetic measurement values in the vehicle width direction of magnetic sensors Cn configuring the sensor unit 11.

The magnetic sensor Cn achieves high sensitivity with a magnetic flux density measurement range of ±0.6 mT and a magnetic flux density resolution within the measurement range of 0.02 μT. As described above, the magnetic marker 10 acts on the order of 8 μT of magnetism at the height of 250 mm, which is the upper limit of the range assumed as the mounting height of the sensor unit 11. Use of the magnetic sensor Cn having the magnetic flux density resolution of 0.02 μT allows detection of the magnetism of the magnetic marker 10 with high reliability.

Part of specifications of the magnetic sensor Cn is provided in Table 2.

TABLE 2

| Measurement range | ±0.6 mT |
|---|---|
| Magnetic flux density resolution | 0.02 μT |
| Sampling frequency | 3 kHz |

(Detection Unit)

The detection unit 12 is an arithmetic unit that acquires the magnetic distribution data in the vehicle width direction output from the sensor unit 11 and executes various arithmetic processes. The detection unit 12 is configured to include a CPU (central processing unit) that executes arithmetic process and a memory element such as a ROM (read only memory) or a RAM (random access memory), and so forth.

The detection unit 12 executes various arithmetic processes on the above-mentioned first and second magnetic distribution data acquired from the sensor unit 11. The arithmetic process includes, in addition to the marker detection process for detecting the magnetic marker 10, determination process for determining the possibility of the presence of the magnetic generation source that causes disturbance, and so forth.

In the marker detection process, the magnetic marker 10 is detected using the first magnetic distribution data that is the distribution of magnetic measurement values in the forwarding direction, and in addition, the lateral shift amount of the vehicle 5 with reference to the magnetic marker 10 is detected using the second magnetic distribution data that is a distribution of magnetic measurement values in the vehicle width direction.

In the determination process, the presence or absence of the magnetic generation source that causes disturbance is determined using the above-mentioned second magnetic distribution data.

The detection unit 12 outputs to the control unit 41, marker detection information reflecting the results of these processes.

(Control Unit)

The control unit 41 is a unit that performs lane tracking control for causing the vehicle 5 to travel along the lane 100 in which the magnetic markers 10 are laid. The control unit 41 performs lane tracking control based on acquired information such as distance information from the forward detection unit 42, the steering angle output from the steering unit 45, and marker detection information from the detection unit 12.

The control unit 41 controls the steering unit 45, the engine throttle unit 46, the brake control unit 47, and the like based on the acquired information described above to cause the vehicle 5 to perform automatic traveling by tracking the lane 100 while maintaining an inter-vehicle distance from the preceding vehicle. Note that when the marker detection information includes determination information indicating the presence of the magnetic generation source that causes disturbance, the control unit 41 switches content of the lane tracking control, thereby avoiding erroneous control.

Next, (1) marker detection process for detecting the magnetic marker 10 and (2) lane tracking control for causing the vehicle 5 to perform automatic traveling by tracking the lane 100 will be described. Further, (3) determination process of the presence or absence of the magnetic generation source other than the magnetic marker 10, that causes disturbance and (4) the content of lane tracking control under an action of disturbance when it is determined that there is the magnetic generation source will be described.

(1) Marker Detection Process

The marker detection process is a process executed by the detection unit 12 by acquiring the first and the second magnetic distribution data from the sensor unit 11.

Here, the method of detecting the magnetic marker 10 through marker detection process will be briefly described. As described above, the magnetic sensor Cn is configured to measure magnetic components in the forwarding direction and the vehicle width direction of the vehicle 5. For example, when any of these magnetic sensors Cn moves in the forwarding direction to pass straight above the magnetic marker 10, the magnetic measurement value in the forwarding direction is reversed between positive and negative before and after the magnetic marker 10 as in FIG. 4, and changes so as to cross zero at the position straight above the magnetic marker 10. Therefore, during travelling of the vehicle 5, when zero-cross X1 occurs where the magnetism detected by any of the magnetic sensors Cn in the forwarding direction is reversed between positive and negative, it can be determined that the sensor unit 11 is positioned straight above the magnetic marker 10.

Also, for example, assume a magnetic sensor with the same specifications as the magnetic sensor Cn is moving along a virtual line in the vehicle width direction passing straight above the magnetic marker 10. The magnetic measurement value in the vehicle width direction measured by this magnetic sensor is reversed between positive and negative on both sides across the magnetic marker 10 and changes so as to cross zero at the position straight above the magnetic marker 10. In the case of the sensor unit 11, as in FIG. 5, with fifteen magnetic sensors Cn arranged in the vehicle width direction, the magnetism in the vehicle width direction detected by the magnetic sensor Cn differs in positive or negative, depending on which side the sensor is present with respect to the magnetic marker 10.

Figure 5:
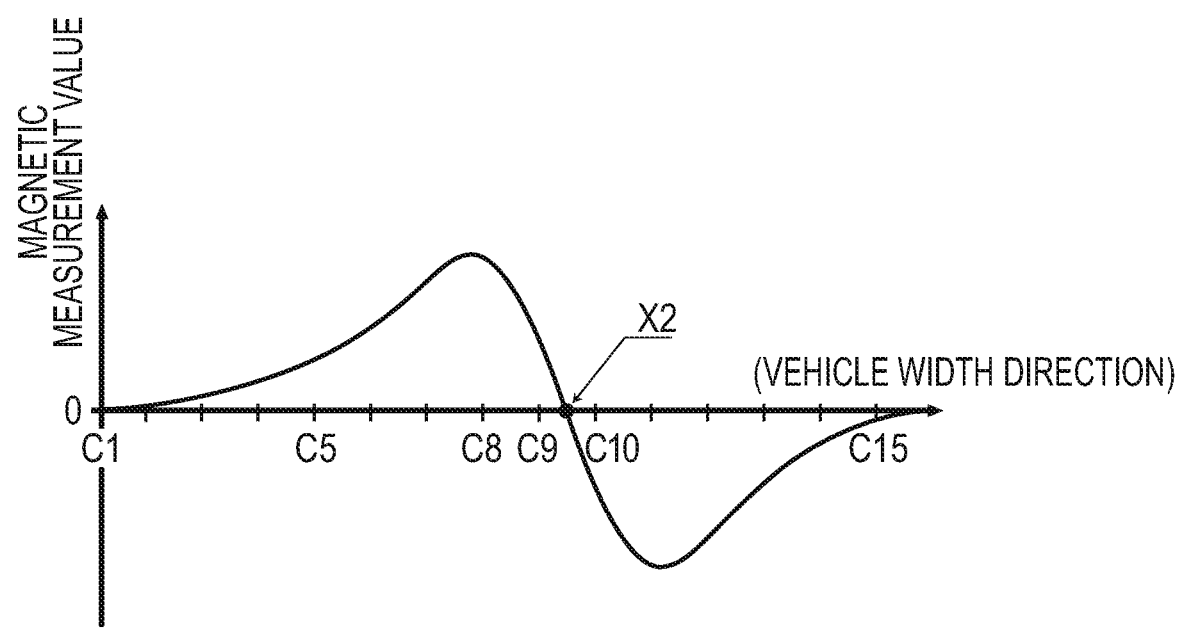
FIG. 5 is a descriptive diagram exemplarily depicting distribution curve of magnetic measurement values in a vehicle width direction by magnetic sensors at the time of passage over a magnetic marker.

That is, the position of zero-cross X2 in the magnetic distribution data in FIG. 5 is the position straight above the magnetic marker 10. For example, as in the case of this figure, the position of the zero-cross X2 at C9.5, which is around the midpoint between the magnetic sensors C9 and C10, is a position straight above the magnetic marker 10 (hereinafter referred to as the position of the magnetic marker 10). Here, in the sensor unit 11 as described above, a space between the adjacent magnetic sensors Cn is 10 cm, and the magnetic sensor C8 is the center of the vehicle 5 in the vehicle width direction. Therefore, in the case of FIG. 5, the position of the magnetic marker 10 is a position shifted by (9.5−8)×10 cm=15 cm to the right side with reference to the center of the vehicle 5 in the vehicle width direction.

Note that, for example, when the vehicle 5 travels closer to the left side in the vehicle width direction, the magnetic marker 10 is shifted to the right side with respect to the sensor unit 11, and the position of the zero-cross X2 is on the right side of the magnetic sensor C8 and of a positive value as exemplarily depicted in FIG. 5. When treating the lateral shift amount to be on a positive side when the vehicle 5 travels closer to the right side and on a negative side when the vehicle 5 travels closer to the left side, in the case of FIG. 5 for example, (−15) cm obtained by reversing the sign in the above described (9.5−8)×10 cm=15 cm, which is the position of the magnetic marker 10, is the lateral shift amount of the vehicle 5.

Figure 6:
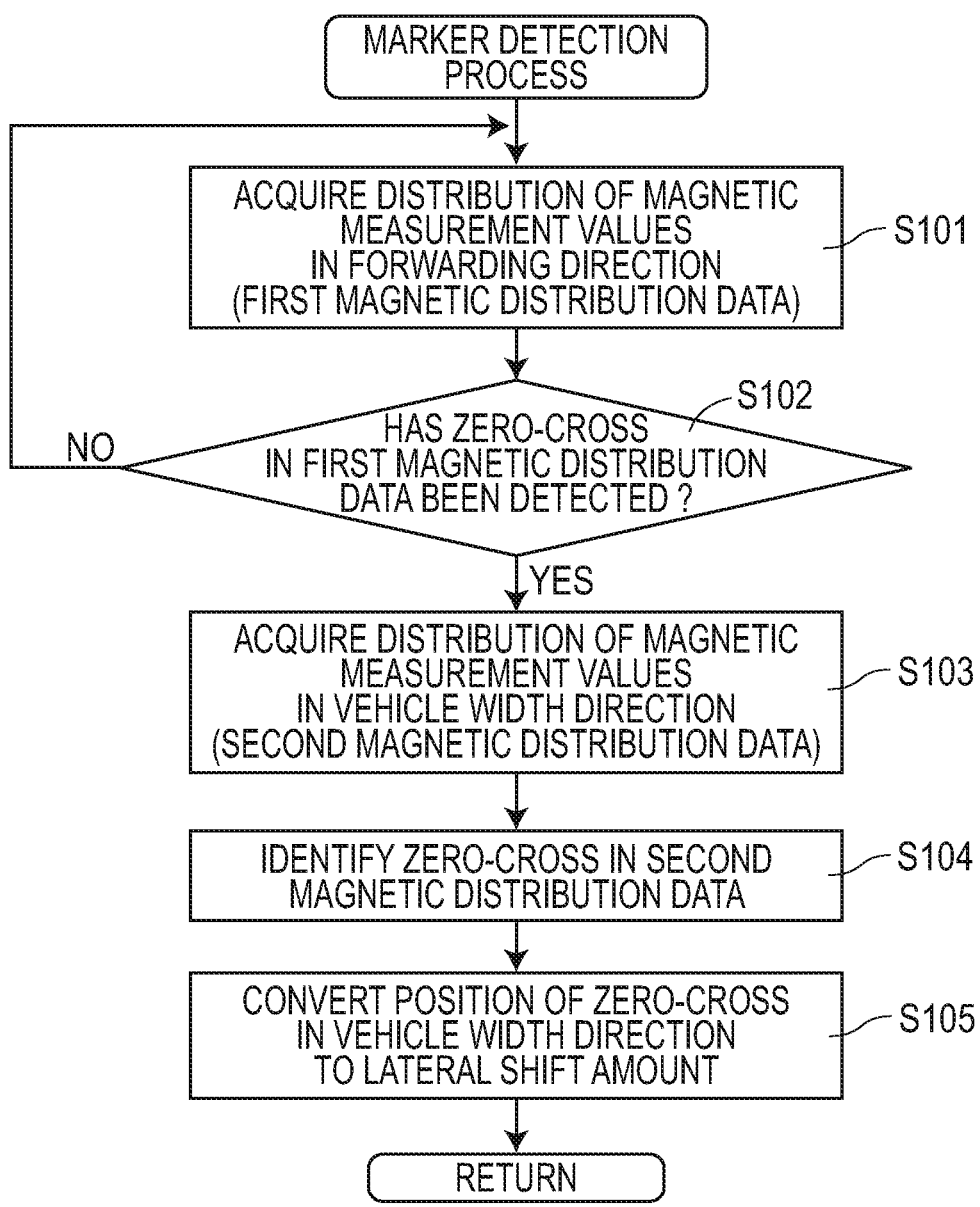
FIG. 6 is a flow diagram depicting a flow of marker detection process.

Next, the flow of marker detection process will be described with reference to FIG. 6.

Figure 4:
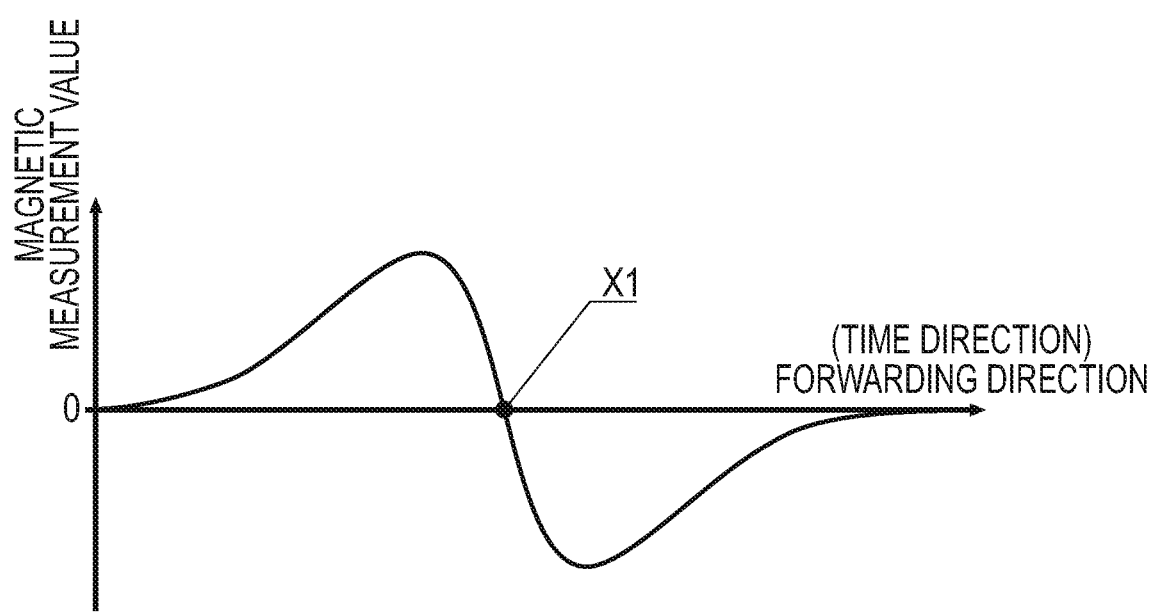
FIG. 4 is a descriptive diagram exemplarily depicting a temporal change of a magnetic measurement value in a forwarding direction at the time of passage over a magnetic marker.

The detection unit 12 acquires the magnetic measurement values in the forwarding direction of the magnetic sensors Cn configuring the first magnetic distribution data (S101) above described. Then, detection of the zero-cross corresponding to X1 in FIG. 4 is attempted regarding a temporal change of the magnetic measurement value in the forwarding direction of at least one of the magnetic sensors Cn (S102). The detection unit 12 repeatedly acquires the magnetic measurement values in the forwarding direction of the magnetic sensors Cn (S101) until the zero-cross is detected (S102: NO).

When the detection unit 12 detects the zero-cross corresponding to X1 in FIG. 4 with respect to the temporal change of the magnetic measurement value in the forwarding direction (S102: YES), the detection unit 12 determines that the sensor unit 11 is positioned straight above the magnetic marker 10. Note that, regarding determination of the detection of the magnetic marker 10, in addition to the detection of the zero-cross corresponding to X1 in FIG. 4, a condition is set in which the rate of temporal change of the magnetic measurement value in the forwarding direction, that is, a size of derivative value (differential value) of the magnetic measurement value should be equal to or larger than a predetermined threshold value.

When the detection unit 12 detects the magnetic marker 10 in response to the detection of the zero-cross corresponding to X1 in FIG. 4, the detection unit 12 acquires the second magnetic distribution data described above representing the distribution of the magnetic measurement values in the vehicle width direction measured at the same timing by magnetic sensors Cn (s103).

The detection unit 12 identifies the position of the zero-cross in the vehicle width direction corresponding to X2 in FIG. 5 with respect to the above-mentioned second magnetic distribution data which is the distribution of the magnetic measurement values in the vehicle width direction of the magnetic sensors Cn (S104). Then, based on this position of the zero-cross in the vehicle width direction, the lateral shift amount of the vehicle 5 in the vehicle width direction with reference to the magnetic marker 10 is identified (S105). Specifically, the detection unit 12 reverses positive and negative of the value indicating the position in the vehicle width direction of the zero-cross corresponding to X2 in FIG. 5 to obtain the lateral shift amount in the vehicle width direction.

(2) Lane Tracking Control

Figure 7:
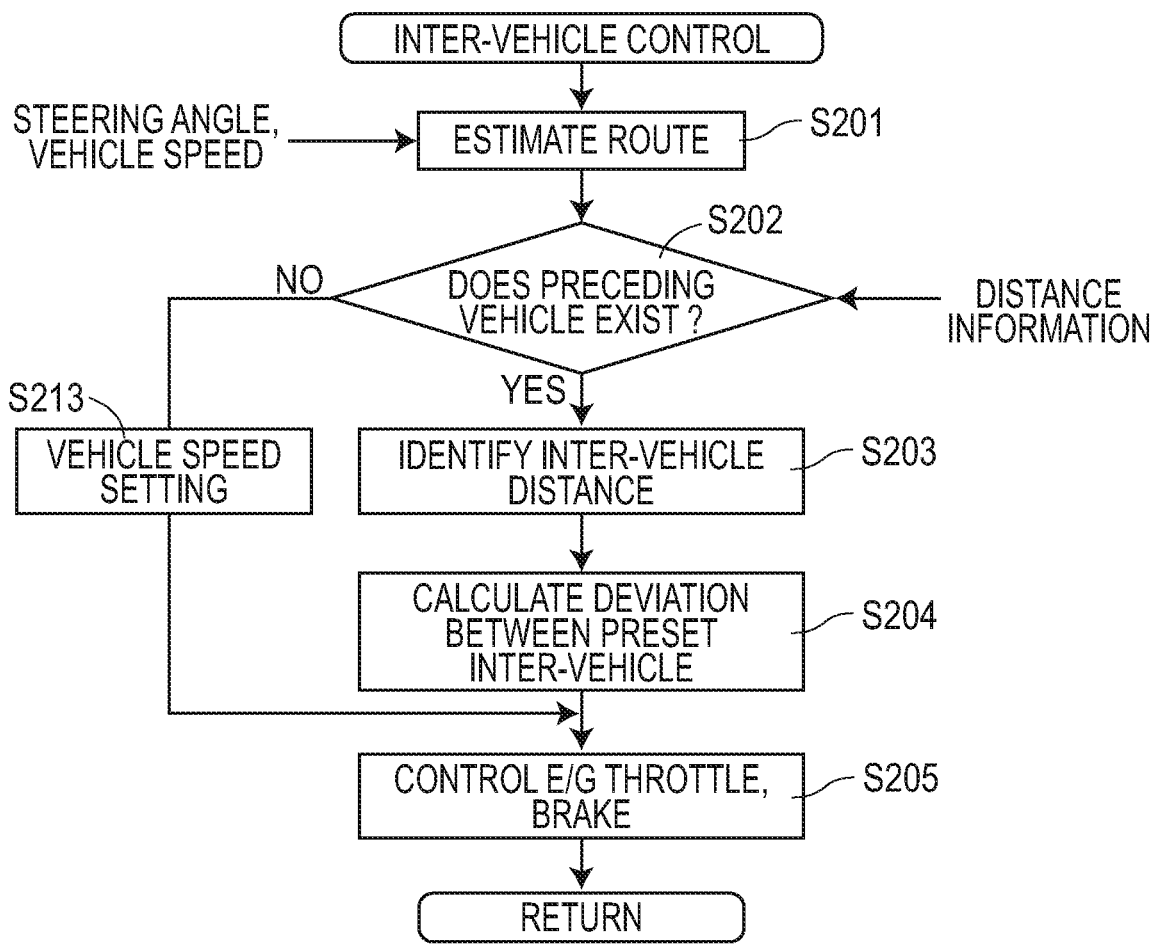
FIG. 7 is a flow diagram depicting a flow of inter-vehicle control.
Figure 8:
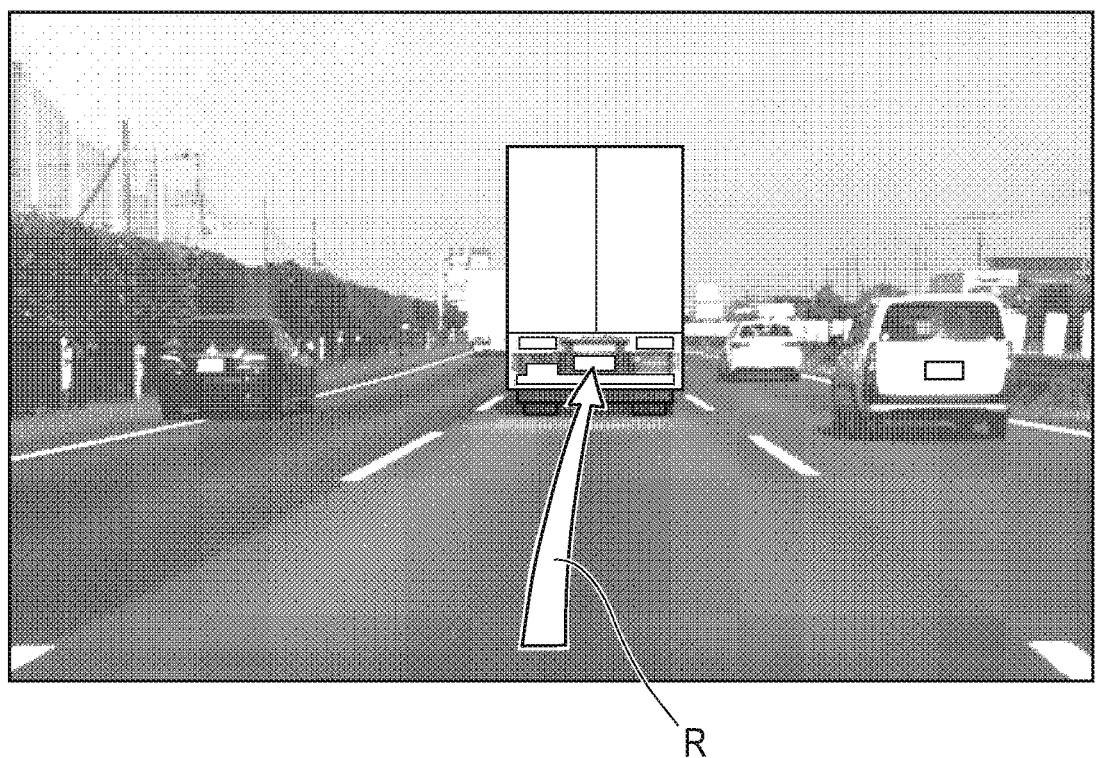
FIG. 8 is a descriptive diagram of a method for selecting a preceding vehicle to track.
Figure 9:
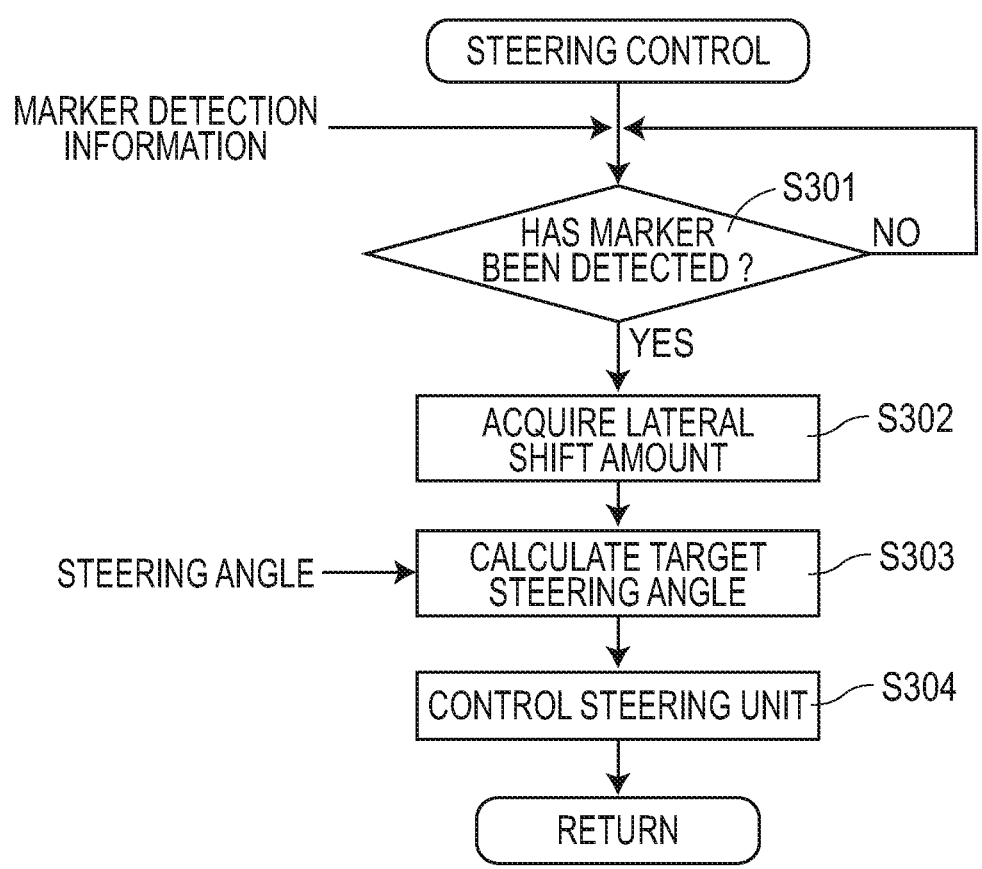
FIG. 9 is a flow diagram depicting a flow of steering control.

In the lane tracking control, an inter-vehicle control in FIG. 7 and a steering control in FIG. 9 are performed in parallel.

As in FIG. 7, the control unit 41 that performs the inter-vehicle control acquires vehicle information such as the steering angle from the steering unit 45 and a vehicle speed, and executes a calculation for estimating a predicted route R (FIG. 8) of the vehicle 5. (S201).

The control unit 41 acquires distance information from the forward detection unit 42 and determines whether or not an object exists on the route R (S202). If the object exists on the route R as in FIG. 8 (S202: YES), this object is selected as the preceding vehicle to track. Then, the control unit 41 reads distance data linked with this preceding vehicle from the distance information described above and identifies the distance data as the inter-vehicle distance (S203). Note that when selecting the preceding vehicle, it is preferable to determine whether the object is a stationary object or a moving object based on the temporal change of the distance to the object, and to select the preceding vehicle on an assumption that the object is a moving object.

The control unit 41 compares the inter-vehicle distance between the preceding vehicle with a preset target inter-vehicle distance (S204). Then, the control unit 41 controls the engine throttle unit 46, the brake control unit 47, and so forth so that the deviation of the actual inter-vehicle distance with respect to the target inter-vehicle distance becomes closer to zero and adjusts the engine output and/or braking force (S205).

On the other hand, when there is no vehicle ahead in the vehicle's own lane and there is no preceding vehicle (S202: NO), a preset target vehicle speed is set (S213). The control unit 41 controls the engine throttle unit 46 and so forth so as to achieve the target vehicle speed and adjusts the engine output and so forth (S205).

Next, as in FIG. 9, the control unit 41 that performs the steering control determines whether or not the magnetic marker 10 has been detected with reference to the marker detection information acquired from the detection unit 12 (S301). When the magnetic marker 10 is detected (S301: YES), the control unit 41 acquires the lateral shift amount included in the marker detection information (S302).

Based on the steering angle output from the steering unit 45 and the lateral shift amount included in the marker detection information, the control unit 41 calculates a target steering angle for making the lateral shift amount closer to zero (S303). Then, the control unit 41 controls the steering unit 45 so that the steering angle of the steering wheel coincides with the target steering angle (S304), thereby achieving automatic traveling of the vehicle 5 by tracking the lane in which the magnetic markers 10 are laid.

(3) Determination Process

Figure 10:
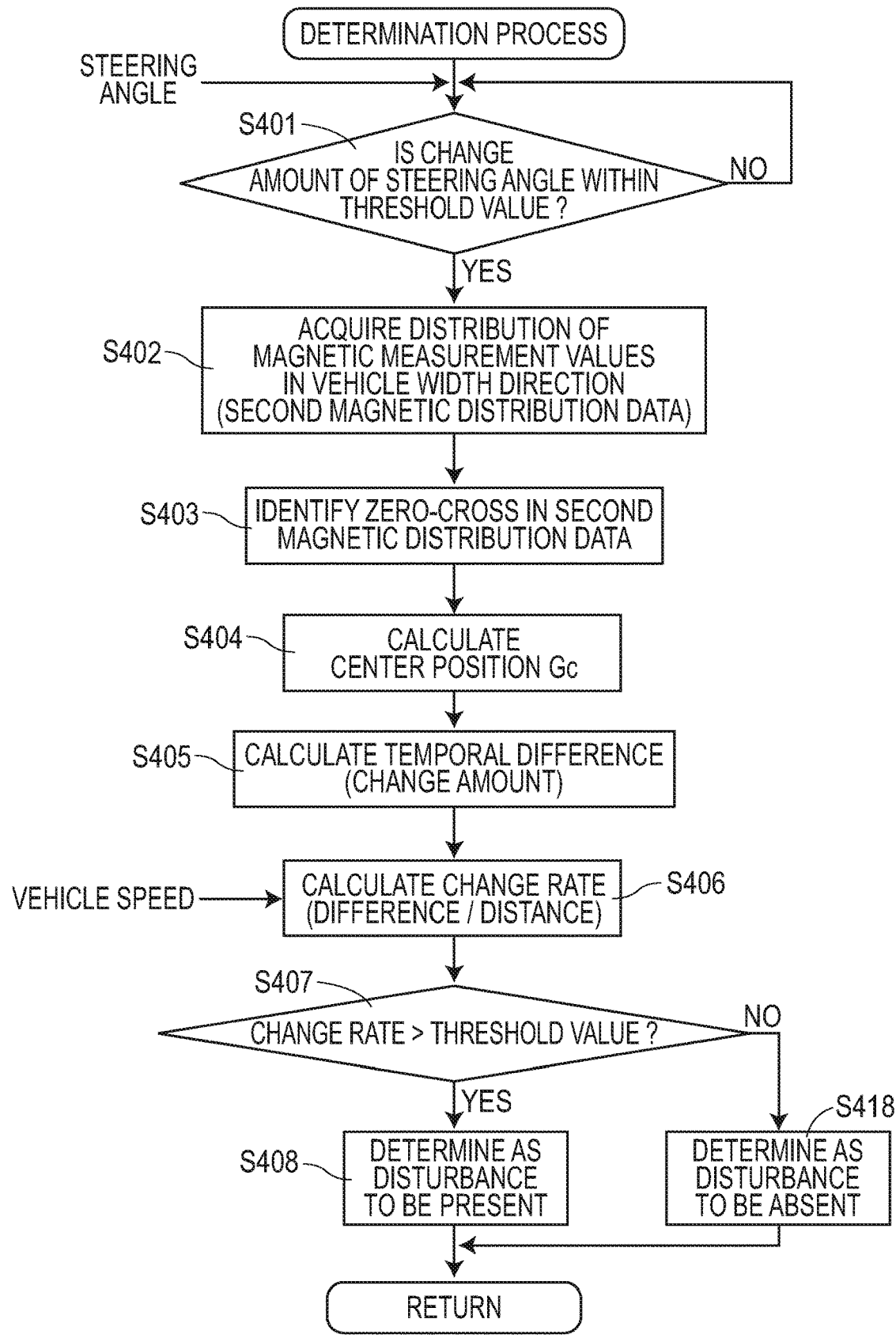
FIG. 10 is a flow diagram depicting a flow of determination process of a magnetic generation source that causes disturbance.

The determination process in FIG. 10 is a process executed by the detection unit 12 (an example of a determination unit) for determining the possibility of the presence of the magnetic generation source other than the magnetic marker 10, that causes disturbance. In this determination process, the possibility of the presence of the magnetic generation source that causes disturbance is determined based on the index representing a degree of positional change of the center position of the magnetic distribution in the vehicle width direction that acts on the sensor unit 11.

Note that in this embodiment, the magnetic markers 10 are laid in a row along a road direction. Therefore, when there is no magnetic generation source that causes disturbance, the center position of the magnetic distribution in the vehicle width direction coincides with the position of the magnetic marker 10. That is, the center position of the magnetic distribution in the vehicle width direction is a position corresponding to the zero-cross X2 in FIG. 5 with respect to the position of the magnetic marker 10.

When the change amount of the steering angle acquired from the steering unit 45 at a certain time cycle is within a threshold value (S401: YES), the detection unit 12 executes the step S402 and subsequent processes as described below and executes the process to determine the possibility of the presence of the magnetic generation source that causes disturbance. On the other hand, if the change amount of the steering angle exceeds the threshold value due to an abrupt steering operation or the like (S401: NO), the step S402 and subsequent processes are omitted based on a determination that there is a high possibility of course changing such as a lane change or the like being performed.

In executing the determination process, the detection unit 12 first acquires the second magnetic distribution data described above, which is the distribution of magnetic measurement values of magnetic sensors Cn in the vehicle width direction (S402). Note that a frequency for acquiring the second magnetic distribution data is 3 kHz, which is the same as the detection frequency of each magnetic sensor Cn of the sensor unit 11. And the detection unit 12 calculates an approximate curve for the second magnetic distribution data in which the magnetic measurement values in the vehicle width direction of magnetic sensors Cn are discretely distributed, and identifies zero-cross where that the approximate curve crosses zero (corresponding to X2 in FIG. 5) (S403).

The detection unit 12 calculates a distance Gc to the zero-cross corresponding to X2 in FIG. 5 with reference to the position of the center magnetic sensor C8 positioned at the center, and identifies it as the center position of the magnetic distribution in the vehicle width direction (S404). For example, in the case exemplarily described in FIG. 5, the position of the zero-cross corresponding to X2 in FIG. 5 is a position corresponding to C9.5 around the midpoint between C9 and C10. As described above, since the space between the magnetic sensors C9 and C10 is 10 cm, the distance Gc representing the center position of the magnetic distribution in the vehicle width direction takes the positive value (9.5−8)×10 cm=15 cm with reference to C8 located at the center. Note that in the following description, the distance Gc representing the center position of the magnetic distribution in the vehicle width direction is simply referred to as a center position Gc.

The detection unit 12 calculates the above-mentioned center position Gc in each acquisition cycle of the second magnetic distribution data described above. Then, a difference between the center position Gc identified in 100 cycles before and the center position Gc identified in the current cycle is calculated as a temporal change amount of the center position (S405). The detection unit 12 further acquires the vehicle speed to identify a travel distance in 100 cycles, and divides the above difference by the travel distance, and thereby obtains a change rate (%) of the center position which is an example of the index representing the degree of change of the center position of the magnetic distribution in the vehicle width direction (S406).

The detection unit 12 executes threshold process on the change rate (%) of the center position (S407), and when this change rate is larger than the threshold value (S407: YES), the detection unit 12 determines that there is the magnetic generation source that causes disturbance (S408). On the other hand, if the change rate is equal to or less than the threshold value (S407: NO), the detection unit 12 determines that there is no magnetic generation source that causes disturbance (S418).

Figure 11:
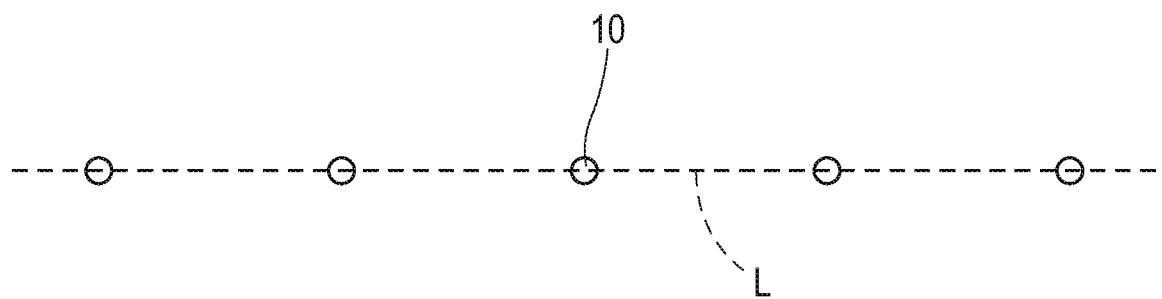
FIG. 11 is a diagram depicting a section without the magnetic generation source that causes disturbance.
Figure 12:
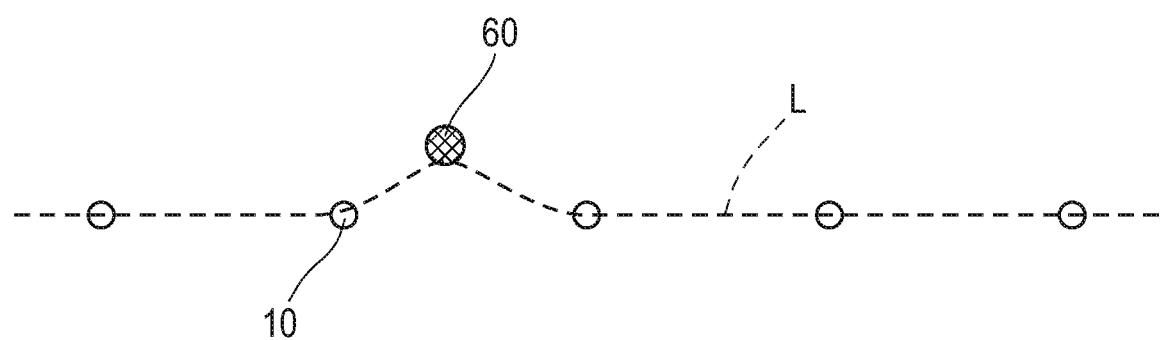
FIG. 12 is a diagram depicting a section with the magnetic generation source that causes disturbance.

Here, the concept of determination based on the change rate of the center position Gc described above will be described with reference to FIG. 11 and FIG. 12. These figures depict lanes in which the magnetic markers 10 are arranged. FIG. 11 depicts a section where there is no magnetic generation source that causes disturbance, and FIG. 12 depicts a section where there is the magnetic generation source other than the magnetic marker 10, that causes disturbance. Note that in these figures, the lanes depicting in the figure are omitted.

The broken lines in FIG. 11 and FIG. 12 depict lines L which connect the center positions of the magnetic distributions in the vehicle width direction. In the section in FIG. 11, the line L extends along the magnetic markers 10 since there is no magnetic generation source other than the magnetic marker 10, that causes disturbance. On the other hand, when there is a magnetic generation source 60 other than the magnetic marker 10, that causes disturbance such as an iron manhole in the vicinity of the magnetic marker 10 as in the section in FIG. 12, the line L connecting the center positions is curved and deformed by being pulled by the magnetic field of this magnetic generation source.

In the section in FIG. 11 where there is no magnetic generation source that causes disturbance, a curvature of the line L is approximately the same as the curvature of the road. On the other hand, in the section in FIG. 12 where there is the magnetic generation source that causes disturbance, the line L is curved and deformed as described above, and the curvature of the line L is likely to take a small value beyond the curvature of the road at the curved and deformed portion. For example, in the case of an expressway or the like, the curvature of the line L may be a small value that is beyond the range of the design curvature of the expressway.

If the vehicle travels along the magnetic markers 10 when the vehicle passes through the section in FIG. 11, the above-mentioned temporal change amount of the center position is expected to become close to zero, and the change rate calculated in the step S406 is expected to become close to zero. On the other hand, if the vehicle travels along the magnetic markers 10 in the section in FIG. 12, when the vehicle reaches the curved and deformed portion described above, the center position of the magnetic distribution in the vehicle width direction identified on the vehicle side fluctuates in the vehicle width direction. At this time, the temporal change amount of the center position of the magnetic distribution in the vehicle width direction increases, and consequently the above-mentioned change rate takes a large value. The determination process of this embodiment is a process for detecting the magnetic generation source by focusing on a fact that the above-mentioned change rate tends to be a large value in a vicinity of the magnetic generation source that causes disturbance.

For example, when the vehicle travels at a speed of 100 km/h, the travel distance per second is about 27.7 m. At this time, the distance of S406 in FIG. 10 described above, which is the movement distance during 100 cycles when sampling is performed at 3 kHz frequency, is approximately 0.92 m (27.7±30). For example, if the limit of the change amount of the center position is 10 cm while the vehicle travels 0.92 m, the threshold value of S407 in the above-mentioned FIG. 10 may be set to 11% (0.1÷0.92), for example. Note that as the threshold value for S407, for example, any value in the range of 1% to 15% may be set.

The difference between the center position of 100 cycles before and the center position identified in the latest cycle is exemplarily described as the temporal change amount of the center position, but a target of the difference is not limited to the center position of 100 cycles before. The center position of 50 cycles before, the center position of 10 cycles before, the center position of 1 cycle before, or the like may be set as the target for the difference.

Furthermore, it is also preferable to correct the change rate (index) that is the target of the threshold process in S407 in FIG. 10 according to the degree of change such as the change amount of the steering angle of the steering wheel of the vehicle, or a yaw rate generated on the vehicle. For example, if the change amount of the above-mentioned steering angle or the yaw rate is larger than a threshold value (another threshold value that is smaller than the threshold value of S401 in FIG. 10), it is also preferable to multiply the above-mentioned change rate by a correction coefficient of less than 1 and correct the value to be smaller. When the steering angle changes largely, or when the yaw rate is generated on the vehicle, the change rate increases even in a situation where there is no magnetic generation source that causes disturbance, and erroneous determination of the presence of disturbance (S408) tends to occur easily. If the change rate (index) is corrected by multiplying the correction coefficients as described above, the tendency of the change rate to increase due to a change in the steering angle or the like can be suppressed. Furthermore, a variable coefficient may be applied, such as, the value of the above-mentioned correction coefficient is decreased as the change degree of the steering angle, the yaw rate, or the like is increased.

(4) Lane Tracking Control Under the Action of Disturbance

When the control unit 41 captures from the detection unit 12 marker detection information including a determination result indicating that there is the magnetic generation source that causes disturbance, the control unit 41 switches the content of the lane tracking control from normal control to control under the action of disturbance.

The difference between control under the action of disturbance and normal control is in a setting of a control gain when calculating the target steering angle based on a measured value of the steering angle and the lateral shift amount with reference to the magnetic marker 10. In the control under the action of disturbance, the control gain is changed to compared with the normal control. Thereby, even if the curvature of the distribution center occurs due to the magnetic generation source that causes disturbance as in FIG. 12, the influence degree on control of the vehicle 5 is suppressed.

Note that the steering control may be stopped when it is determined that there is the magnetic generation source that causes disturbance. In this case, it is preferable to have a driver to perform the steering operation by displaying a display indicating that the lane tracking control is temporarily suspended, for example, on such as the display panel of the driver's seat. Note that the inter-vehicle control may be continued as it is based on the measured value of the steering angle and the distance information by the forward detection unit 42.

As described above, the marker detection method of the present embodiment is a method to determine the presence or absence of the magnetic generation source that causes disturbance by focusing on the center position of the magnetic distribution in the vehicle width direction acting on the vehicle 5 side. When the vehicle 5 travels tracking the road in which the magnetic markers 10 are laid, if there is no magnetic generation source other than the magnetic marker 10, the center position of the magnetic distribution in the vehicle width direction becomes nearly constant. On the other hand, if there is the magnetic generation source other than the magnetic marker 10, that causes disturbance, the magnetic distribution in the vehicle width direction acting on the vehicle 5 side may be disturbed, and there is a high possibility that the center position of the magnetic distribution in the vehicle width direction may be shifted. By focusing on the center position of the magnetic distribution in the vehicle width direction as described above, it is possible to determine with high reliability the presence or absence of the magnetic generation source that causes disturbance.

In addition, the vehicular system 1 that performs the marker detection method described above switches control for the vehicle 5 to perform automatic traveling by tracking the lane according to the presence or absence of the magnetic generation source that causes disturbance. When it is determined that there is the magnetic generation source that causes disturbance, the control gain is decreased to slow a reaction on the vehicle 5 side, thereby suppressing the disturbance of behavior caused by the magnetic generation source that causes disturbance.

Note that in this embodiment, a temporal change rate of the center position of the magnetic distribution in the vehicle width direction is exemplarily described as an index for determining the presence or absence of the magnetic generation source that causes disturbance. Instead of this change rate, it is also preferable to determine the presence or absence of the magnetic generation source that causes disturbance by using the temporal change amount in the center position of the magnetic distribution in the vehicle width direction as the index.

In this embodiment, when the change amount of the steering angle exceeds the threshold value, the determination process for the presence or absence of the magnetic generation source that causes disturbance is configured so as not to be executed. Instead of the change amount of the steering angle, the yaw rate generated on the vehicle may be set. If the yaw rate is larger than the threshold value, it is highly likely that the driver's intentional steering operation is being performed to change lanes or the like, and it is preferable to determine that the process for determining the presence or absence of the magnetic generation source that causes disturbance is inadequate. For example, two threshold values in different size may be set for the yaw rate, and when the yaw rate is larger than the smaller threshold value and less than the larger threshold value, the change rate may be corrected using the correction coefficient described above, while the yaw rate is equal to or larger than the larger threshold value, an operation such as canceling the determination process may be performed.

The vehicular system 1 may estimate the curvature of the road ahead by using a relative shift or the like in the vehicle width direction of the preceding vehicle. It is also preferable to change the threshold value of the change amount of the steering angle in the above-mentioned step S401 for determining whether or not to execute the determination process according to the estimated curvature. For example, when the estimated curvature is a large value representing a straight road, it is predicted that the steering operation is hardly performed, and thus the threshold value of the change amount of the steering angle may be decreased. On the other hand, when the estimated curvature takes a value representing a curve, the steering operation for changing the course direction is expected, and thus it is preferable to slightly increase the threshold value of the change amount of the steering angle. If the navigation device capable of acquiring a curvature data of the road ahead is mounted on the vehicle 5, the threshold value of the change amount of the steering angle in above-mentioned step S401 may be changed according to the curvature of the road ahead.

In this embodiment, as the possibility of the presence of the magnetic generation source that causes disturbance, the presence or absence of the magnetic generation source that causes disturbance is determined, however, instead of this, it is also preferable to represent the possibility stochastically, such as 100%, 60%, and 20%. Alternatively, the possibility of the presence may be represented by a degree or the like such as level 2, level 5 and level 9, with level 10 as an upper limit. As the possibility of the presence, the index value such as the above-mentioned change rate and the change amount may be replaced with a stochastic numerical value or a degree.

For lane tracking control when the possibility of the presence of the magnetic generation source is represented by the stochastic numerical value or a degree, the control gain may be changed stepwise depending on the degree or the like. Alternatively, by threshold process on the degree or the like, lane tracking control may be performed when the degree is equal to or less than the threshold value, while lane tracking control may be suspended when the degree exceeds the threshold value.

In this embodiment, the magnetic sensor Cn having sensitivity in the forwarding direction and the vehicle width direction of the vehicle is adopted. Instead of this, a magnetic sensor having sensitivity in one axis direction of the vertical direction, the forwarding direction, or the vehicle width direction may be adopted. Or two axial directions of the vehicle width direction and the vertical direction, or two axial directions of the forwarding direction and the vertical direction may also be adopted. Or a magnetic sensor having sensitivity in the three axial directions of the vehicle width direction, the forwarding direction, and the vertical direction may be adopted.

Figure 13:
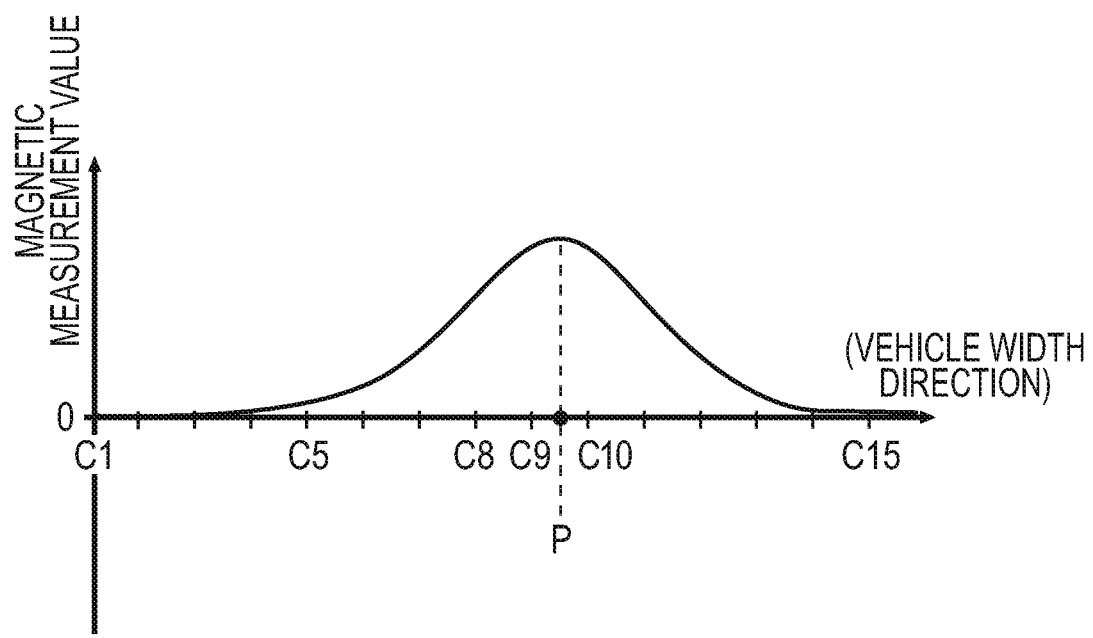
FIG. 13 is a descriptive diagram exemplarily depicting other distribution curve of magnetic measurement values in the vehicle width direction by magnetic sensors at the time of passage over a magnetic marker.

For example, when a sensor unit in which magnetic sensors Cn having sensitivity in the vertical direction are arranged in the vehicle width direction is adopted, as exemplarily described in FIG. 13, a line-symmetric magnetic distribution similar to a normal distribution is obtained in which the magnetic measurement value reaches maximum at the position straight above the magnetic marker and then gradually decreases relative to a distance away from the position straight above in the vehicle width direction. For the line-symmetric magnetic distribution that has the normal distribution and without appearance of the zero-cross appears as depicted in the figure, the peak point P that is the position of the maximum value may be handled as the center position of the magnetic distribution.

In this embodiment, the columnar magnetic marker 10 having a diameter of 20 mm and a height of 28 mm is exemplarily described. However, for example, a sheet-shaped magnetic marker having a thickness of 1 to 5 mm and a diameter of on the order of 80 to 120 mm may be adopted. As the magnet of the magnetic marker, for example, a ferrite rubber magnet or the like that is similar to a magnet sheet used for office work, in a kitchen, or the like may be adopted.

In the foregoing, while specific examples of the present invention have been described in detail as in the embodiments, these specific examples each merely disclose an example of technology included in the scope of claims for patent. Needless to say, the scope of claims for patent should not be interpreted in a limited manner by the configuration, numerical values, or the like in the specific examples. The scope of claims for patent includes techniques where the above-mentioned specific examples are modified, changed, or appropriately combined in various ways using publicly known technology and knowledge of those skilled in the art, and so forth.

REFERENCE SIGNS LIST

1 vehicular system
10 magnetic marker
100 lane
11 sensor unit (magnetic detection unit)
110 data generation circuit
12 detection unit (determination unit)
41 control unit
42 forward detection unit
5 vehicle
Cn magnetic sensor (n is an integer from 1 to 15)

The invention claimed is:

1. A marker detection method, comprising:
    (1) performing a marker detection process, including
        acquiring, using a plurality of magnetic sensors arranged in a vehicle width direction of a vehicle, a first magnetic distribution in a forwarding direction of the vehicle, the plurality of magnetic sensors being attached to the vehicle,
        determining, using processing circuitry, whether a zero-cross, where magnetism is reversed between positive and negative, or a peak point, where magnetism has a maximum value in a line-symmetric magnetic distribution, exists in the first magnetic distribution,
        in response to determining that the zero-cross or the peak point exists in the first magnetic distribution, determining, using the processing circuitry, that a magnetic marker laid in a road exists, and acquiring, using the plurality of magnetic sensors, a second magnetic distribution in the vehicle width direction of the vehicle,
        identifying, using the processing circuitry, a location in the vehicle width direction of the zero-cross or the peak point in the second magnetic distribution, and
        calculating, using the processing circuitry, a lateral shift amount of the vehicle in the vehicle width direction using the identified location in the vehicle width direction of the zero-cross or the peak point in the second magnetic distribution; and
    (2) performing a magnetic generation source detection process, including
        acquiring, using the plurality of magnetic sensors, the second magnetic distribution in the vehicle width direction of the vehicle at a frequency of time,
        identifying, using the processing circuitry, the location in the vehicle width direction of the zero-cross or the peak point in the second magnetic distribution at the frequency of time,
        calculating, using the processing circuitry, a difference between a first location in the vehicle width direction of the zero-cross or the peak point in the second magnetic distribution at a first time and a second location in the vehicle width direction of the zero-cross or the peak point in the second magnetic distribution at a second time after the first time,
        calculating, using the processing circuitry, a change rate of the location in the vehicle width direction of the zero-cross or the peak point in the second magnetic distribution, using the calculated difference, the first time and the second time, and
        determining, using the processing circuitry, using the calculated change rate, a possibility of a presence of a magnetic generation source, other than the magnetic marker laid in the road, wherein
    the method further comprises
        performing control for assisting driving of the vehicular system, and
        switching control contents, including whether or not to perform the control for assisting driving of the vehicular system, in accordance with the possibility of the presence of the magnetic generation source.

2. The marker detection method according to claim 1, wherein the change rate is a positional change amount of the location in the vehicle width direction of the zero-cross or the peak point in the second magnetic distribution, or a ratio of the positional change amount with reference to a travel distance of the vehicle.

3. The marker detection method according to claim 1, wherein the change rate is corrected by a degree of a change of a steering angle of a steering wheel of the vehicle.

4. The marker detection method according to claim 1, wherein the change rate is corrected by a generated on the vehicle.

5. The marker detection method according to claim 1, wherein the possibility of the presence of the magnetic generation source is determined when a value representing a degree of a change of a steering angle of a steering wheel of the vehicle is smaller than a predetermined threshold value.

6. The marker detection method according to claim 1, wherein the possibility of the presence of the magnetic generation source is determined when a value of a yaw rate generated on the vehicle is smaller than a predetermined threshold value.

7. The marker detection method according to claim 2, wherein the change rate is corrected by a degree of a change of a steering angle of a steering wheel of the vehicle.

8. The marker detection method according to claim 2, wherein the change rate is corrected by a yaw rate generated on the vehicle.

9. The marker detection method according to claim 3, wherein the change rate is corrected by a yaw rate generated on the vehicle.

10. The marker detection method according to claim 7, wherein the change rate is corrected by a yaw rate generated on the vehicle.

11. The marker detection method according to claim 2, wherein the possibility of the presence of the magnetic generation source is determined when a value representing a degree of a change of a steering angle of a steering wheel of the vehicle is smaller than a predetermined threshold value.

12. The marker detection method according to claim 3, wherein the possibility of the presence of the magnetic generation source is determined when a value representing the degree of the change of the steering angle of the steering wheel of the vehicle is smaller than a predetermined threshold value.

13. The marker detection method according to claim 4, wherein the possibility of the presence of the magnetic generation source is determined when a value representing a degree of a change of a steering angle of a steering wheel of the vehicle is smaller than a predetermined threshold value.

14. The marker detection method according to claim 2, wherein the possibility of the presence of the magnetic generation source is determined when a value of a yaw rate generated on the vehicle is smaller than a predetermined threshold value.

15. The marker detection method according to claim 3, wherein the possibility of the presence of the magnetic generation source is determined when a value of a yaw rate generated on the vehicle is smaller than a predetermined threshold value.

16. The marker detection method according to claim 4, wherein the possibility of the presence of the magnetic generation source is determined when a value of the yaw rate generated on the vehicle is smaller than a predetermined threshold value.

17. The marker detection method according to claim 5, wherein the possibility of the presence of the magnetic generation source is determined when a value of a yaw rate generated on the vehicle is smaller than a predetermined threshold value.

18. The marker detection method according to claim 1, wherein
the first determining in the marker detection process determines whether the zero-cross exists in the first magnetic distribution,
the identifying in the marker detection process identifies the location in the vehicle width direction of the zero-cross in the second magnetic distribution,
the calculating in the marker detection process calculates the lateral shift amount of the vehicle in the vehicle width direction using the identified location in the vehicle width direction of the zero-cross in the second magnetic distribution,
the identifying in the magnetic generation source detection process identifies the location in the vehicle width direction of the zero-cross in the second magnetic distribution at the frequency of time,
the first calculating in the magnetic generation source detection process calculates the difference between the first location in the vehicle width direction of the zero-cross in the second magnetic distribution at the first time and the second location in the vehicle width direction of the zero-cross in the second magnetic distribution at the second time after the first time, and
the second calculating in the magnetic generation source detection process calculates the change rate of the location in the vehicle width direction of the zero-cross in the second magnetic distribution, using the calculated difference, the first time and the second time.

19. The marker detection method according to claim 1, further comprising:
changing a control gain for the control for assisting driving of the vehicular system in a case where the magnetic generation source is determined to be present.

20. The marker detection method according to claim 1, wherein
the possibility of the presence of the magnetic generation source is determined as an index value, and
the method further comprises changing a control gain for the control for assisting driving of the vehicular system based on the index value.

21. The marker detection method according to claim 1, wherein
the possibility of the presence of the magnetic generation source is determined as an index value, and
the method further comprises suspending the control for assisting driving of the vehicular system in a case where the index value exceeds a threshold value.

22. A vehicular system, comprising:
a plurality of magnetic sensors arranged in a vehicle width direction of the vehicular system and
processing circuitry configured to
(1) perform a marker detection process, including
acquiring, using the plurality of magnetic sensors, a first magnetic distribution in a forwarding direction of the vehicular system,
determining whether a zero-cross, where magnetism is reversed between positive and negative, or a peak point, where magnetism has a maximum value in a line-symmetric magnetic distribution, exists in the first magnetic distribution,
in response to determining that the zero-cross or the peak point exists in the first magnetic distribution, determining that a magnetic marker laid in a road exists, and acquiring, using the plurality of magnetic sensors, a second magnetic distribution in the vehicle width direction of the vehicular system,
identifying a location in the vehicle width direction of the zero-cross or the peak point in the second magnetic distribution, and
calculating a lateral shift amount of the vehicular system in the vehicle width direction using the identified location in the vehicle width direction of the zero-cross or the peak point in the second magnetic distribution, and
(2) perform a magnetic generation source detection process, including
acquiring, using the plurality of magnetic sensors, the second magnetic distribution in the vehicle width direction of the vehicular system at a frequency of time,
identifying the location in the vehicle width direction of the zero-cross or the peak point in the second magnetic distribution at the frequency of time,
calculating a difference between a first location in the vehicle width direction of the zero-cross or the peak point in the second magnetic distribution at a first time and a second location in the vehicle width direction of the zero-cross or the peak point in the second magnetic distribution at a second time after the first time,
calculating a change rate of the location in the vehicle width direction of the zero-cross or the peak point in the second magnetic distribution, using the calculated difference, the first time and the second time, and
determining, using the calculated change rate, a possibility of a presence of a magnetic generation source, other than the magnetic marker laid in the road, wherein
the processing circuitry is further configured to:
perform control for assisting driving of the vehicular system, and
switch control contents, including whether or not to perform the control for assisting driving of the vehicular system, in accordance with the possibility of the presence of the magnetic generation source.

* * * * *